(12) United States Patent
Lee et al.

(10) Patent No.: US 12,515,235 B2
(45) Date of Patent: Jan. 6, 2026

(54) DUAL-SLOT DIE COATER

(71) Applicant: LG Energy Solution, Ltd., Seoul (KR)

(72) Inventors: Taek-Soo Lee, Daejeon (KR);
Shin-Wook Jeon, Daejeon (KR);
Young-Joon Jo, Daejeon (KR);
Sang-Hoon Choy, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 491 days.

(21) Appl. No.: 17/922,878

(22) PCT Filed: Oct. 14, 2021

(86) PCT No.: PCT/KR2021/014247
§ 371 (c)(1),
(2) Date: Nov. 2, 2022

(87) PCT Pub. No.: WO2022/145652
PCT Pub. Date: Jul. 7, 2022

(65) Prior Publication Data
US 2023/0158539 A1 May 25, 2023

(30) Foreign Application Priority Data

Dec. 29, 2020 (KR) .................. 10-2020-0185693

(51) Int. Cl.
*B05C 5/02* (2006.01)
*H01M 10/04* (2006.01)

(52) U.S. Cl.
CPC ....... *B05C 5/0262* (2013.01); *H01M 10/0404* (2013.01)

(58) Field of Classification Search
None
See application file for complete search history.

(56) References Cited

U.S. PATENT DOCUMENTS 5,422,137 A * 6/1995 Huebler ................. G11B 5/848
6,689,432 B2 * 2/2004 Kitamura ............. B41M 5/5218
428/32.25

(Continued)

FOREIGN PATENT DOCUMENTS

JP      H08038975 A     2/1996
JP      2547972 B2     10/1996
(Continued)

OTHER PUBLICATIONS

International Search Report for Application No. PCT/KR2021/014247 mailed Jan. 20, 2022, pp. 1-3.

(Continued)

*Primary Examiner* — Jethro M. Pence
(74) *Attorney, Agent, or Firm* — Lerner David LLP (57) ABSTRACT

A dual-slot die coater including a first slot and a second slot for discharging a coating solution in a direction opposite to gravity, a first die block vertically installed on a rear portion of an upper surface of a base, a second die block arranged on a front surface of the first die block to form the first slot between the second die block and the first die block, and a third die block arranged on a front surface of the second die block to form the second slot between the third die block and the second die block, and further includes an alignment block provided between a front portion of the upper surface of the base and a lower surface of the second die block and fastened and coupled to the lower surface of the second die block and a lower surface of the first die block by bolts.

14 Claims, 4 Drawing Sheets

(56) References Cited

U.S. PATENT DOCUMENTS

| | | | | |
|---|---|---|---|---|
| 6,813,820 | B2 * | 11/2004 | Nelson | B05C 5/007 |
| | | | | 118/406 |
| 7,615,175 | B2 * | 11/2009 | Nelson | B05C 5/007 |
| | | | | 264/212 |
| 11,161,140 | B2 * | 11/2021 | Lee | B05C 5/0283 |
| 11,691,173 | B2 * | 7/2023 | Lee | B05C 11/1002 |
| | | | | 118/300 |
| 11,772,119 | B2 * | 10/2023 | Lee | H01M 4/0409 |
| | | | | 118/315 |
| 11,964,298 | B2 * | 4/2024 | Seol | H01M 4/0404 |
| 12,053,796 | B2 * | 8/2024 | Lee | H01M 4/0404 |
| 12,103,036 | B2 * | 10/2024 | Lee | B05C 5/0262 |
| 12,134,107 | B2 * | 11/2024 | Lee | B05C 5/0254 |
| 12,157,140 | B2 * | 12/2024 | Lee | B05C 5/027 |
| 12,257,599 | B2 * | 3/2025 | Lee | H01M 4/0404 |
| 2003/0157252 | A1 | 8/2003 | Tokimasa et al. | |
| 2005/0211164 | A1 | 9/2005 | Tokimasa et al. | |
| 2006/0096528 | A1 | 5/2006 | Kawatake et al. | |
| 2010/0285227 | A1 * | 11/2010 | Yapel | B05C 5/007 |
| | | | | 118/200 |
| 2011/0027493 | A1 * | 2/2011 | Yapel | B05D 1/26 |
| | | | | 427/521 |
| 2019/0118215 | A1 | 4/2019 | Yamane et al. | |
| 2022/0134378 | A1 | 5/2022 | Kim et al. | |
| 2023/0080280 | A1 * | 3/2023 | Lee | H01M 4/0411 |
| | | | | 118/407 |
| 2023/0085121 | A1 * | 3/2023 | Lee | H01M 4/0404 |
| | | | | 239/592 |
| 2023/0127081 | A1 * | 4/2023 | Lee | H01M 4/04 |
| | | | | 118/300 |
| 2023/0127571 | A1 * | 4/2023 | Lee | H01M 4/139 |
| | | | | 429/209 |
| 2023/0133585 | A1 * | 5/2023 | Lee | H01M 4/0404 |
| 2023/0158539 | A1 * | 5/2023 | Lee | B05C 9/06 |
| | | | | 118/313 |
| 2023/0201861 | A1 * | 6/2023 | Lee | H01M 10/0404 |
| | | | | 118/255 |
| 2023/0211370 | A1 * | 7/2023 | Lee | B05C 9/06 |
| | | | | 118/300 |
| 2023/0219112 | A1 * | 7/2023 | Lee | B05C 5/0262 |
| | | | | 118/125 |
| 2023/0249216 | A1 * | 8/2023 | Lee | B05C 5/0254 |
| | | | | 118/125 |
| 2024/0033771 | A1 * | 2/2024 | Lee | H01M 4/04 |
| 2024/0050975 | A1 * | 2/2024 | Lee | B05C 5/0254 |
| 2024/0063362 | A1 * | 2/2024 | Choi | H01M 10/0404 |
| 2024/0116072 | A1 * | 4/2024 | Moon | H01M 4/0404 |
| 2024/0149292 | A1 * | 5/2024 | Park | B05C 9/06 |
| 2024/0207885 | A1 * | 6/2024 | Park | B05C 5/0254 |
| 2024/0299970 | A1 * | 9/2024 | Jo | B05C 5/0254 |
| 2024/0382997 | A1 * | 11/2024 | Park | B05C 5/02 |
| 2024/0399410 | A1 * | 12/2024 | Choi | B05C 11/10 |
| 2025/0041894 | A1 * | 2/2025 | Lee | B05C 5/0254 |
| 2025/0091083 | A1 * | 3/2025 | Park | H01M 4/0404 |

FOREIGN PATENT DOCUMENTS

| | | |
|---|---|---|
| JP | 2003275652 A | 9/2003 |
| JP | 2005270877 A | 10/2005 |
| JP | 2008043875 A | 2/2008 |
| JP | 4389607 B2 | 12/2009 |
| JP | 2019107606 A | 7/2019 |
| JP | 2019217453 A | 12/2019 |
| JP | 2020131082 A | 8/2020 |
| JP | 2020131084 A | 8/2020 |
| JP | 6788234 B2 | 11/2020 |
| KR | 20190045861 A | 5/2019 |
| KR | 20200035642 A | 4/2020 |
| KR | 20200131620 A | 11/2020 |

OTHER PUBLICATIONS

Extended European Search Report including Written Opinion for Application No. 21915450.7 dated Feb. 15, 2024, pp. 1-8.

Search Report for Chinese Application No. 202180030693.7 issued Mar. 28, 2025. 3 pages.

* cited by examiner

FIG. 1

RELATED ART

DUAL-SLOT DIE COATER

CROSS-REFERENCE TO RELATED APPLICATIONS

This application is a national phase entry under 35 U.S.C. § 371 of International Application No. PCT/KR2021/014247, filed on Oct. 14, 2021, which claims priority to Korean Patent Application No. 10-2020-0185693, filed on Dec. 29, 2020, the disclosures of which are incorporated herein by reference.

TECHNICAL FIELD

The present disclosure relates to a dual-slot die coater capable of simultaneously forming two or more layers by wetting. In particular, the present disclosure relates to a dual-slot die coater having a means for controlling a width direction deviation of a coating gap.

BACKGROUND ART

As technology development and demand for mobile devices increase, the demand for secondary batteries as an energy source is rapidly increasing, and such secondary batteries essentially include an electrode assembly which is a power generation element. The electrode assembly has a form in which a positive electrode, a separator, and a negative electrode are stacked at least once, and the positive electrode and the negative electrode are prepared by coating and drying a positive electrode active material slurry and a negative electrode active material slurry on current collectors made of aluminum foil and copper foil, respectively. In order to equalize charging/discharging features of secondary batteries, the positive electrode active material slurry and the negative electrode active material slurry should be uniformly coated on the current collectors, and a slot die coater is conventionally used therefor.

Figure 1:
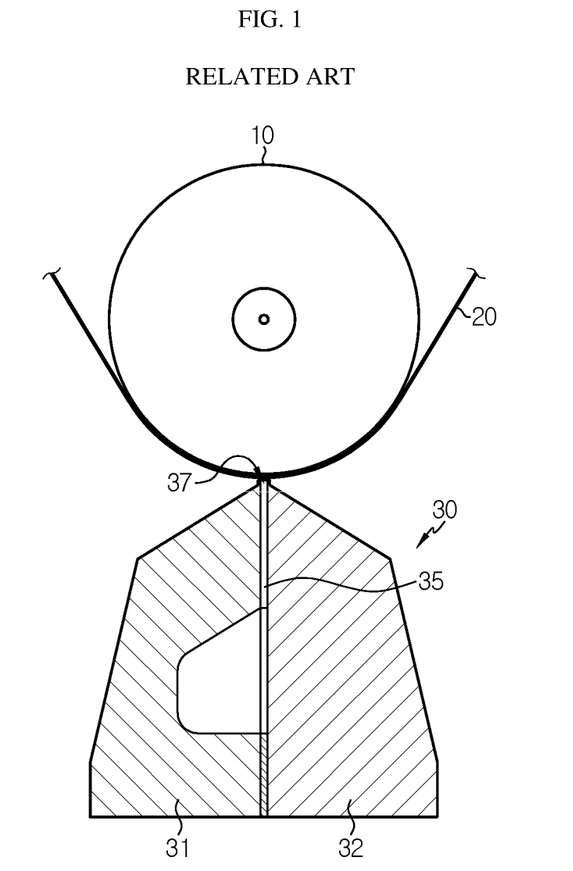
FIG. 1 is a schematic cross-sectional view of a conventional slot die coater.

FIG. 1 is a cross-sectional view of a conventional slot die coater.

Referring to FIG. 1, in an electrode manufacturing method using the slot die coater, an active material slurry discharged from a slot die coater 30 is coated on an current collector 20 transferred by a coating roll 10. The active material slurry discharged from the slot die coater 30 is widely coated on one surface of the current collector 20 to form an active material layer. The slot die coater 30 includes two die blocks 31 and 32 and forms a single slot 35 between the two die blocks 31 and 32, and may form the active material layer of one layer by discharging one type of active material slurry through a discharge port 37 communicatively connected to the single slot 35. A slot die coater enables fast coating as compared with bar coating or comma coating, and thus has been widely applied in terms of high productivity. The slot die coater exemplified in FIG. 1 is a vertical die type in which an active material slurry is discharged in a direction opposite to gravity.

In order to manufacture a secondary battery of high energy density, the thickness of the active material layer which was about 130 µm gradually increased to reach 300 µm. When the thick active material layer is formed with the conventional slot die coater 30, since migration of a binder and a conductive material in the active material slurry deepens during drying, a final electrode is manufactured non-uniformly. In order to solve this problem, when coating is performed two times such as coating thinly and drying the active material layer and then coating and drying the active material layer, it takes a long time. In order to simultaneously improve electrode performance and productivity, a dual slot die coater capable of simultaneously coating two types of electrode active material slurries is required.

Since a slot die coater constitutes a slot on a coupling surface of die blocks, basically three die blocks are required to include two slots like the dual slot die coater. Since a process using the dual slot die coater should use active material slurries simultaneously discharged from different discharge ports, it is quite difficult to form each active material layer to a desired thickness.

A separation distance from a discharge port to the surface of a current collector is a coating gap, which is a very important variable in determining the coating quality of an active material layer. In general, the thickness of each active material layer is affected by the discharge amount of each of the active material slurries through the discharge ports, the types of the active material slurries, and the coating gap. When the coating gap is uniform in a width direction (transverse direction (TD)) of the current collector, stable coating is possible, and, when there is a coating gap deviation in the width direction, a coating width and the shape of a non-coated portion boundary have a lot of influence. The thickness of an active material layer is a very small value of several tens to several hundreds of µm, and should be very strictly controlled because even a change of only several µm in the thickness seriously affects the coating quality. The thickness of the active material layer needs to be very strictly controlled so as to exhibit uniform dimensional accuracy in the width direction in order to stably perform uniform coating in the width direction of the current collector. However, when the width of the dual-slot die coater increases in order to use a long-width current collector to increase production, it becomes more difficult to perform uniform coating in the width direction, and precise control of the coating gap becomes more necessary.

In addition, an appropriate coating gap range is determined according to the type of active material slurry. In a production process, it is necessary to manufacture various products using several types of active material slurries instead of using one type of active material slurry. In order to use various active material slurries, it is difficult to individually provide a dual-slot die coater dedicated to each active material slurry. Therefore, it is necessary to coat a certain type of active material slurry by using one dual-slot die coater and then coat another type of active material slurry by using the dual-slot die coater. In this case, a previously set coating gap needs to be changed. In addition, since it is difficult to always uniformly manufacture the same type of active material slurries, there is dispersion in physical properties of the active material slurries depending on a manufacturing time point, so it is necessary to respond to such dispersion. Moreover, coating gap control becomes more important because fast coating reveals great coating quality variations due to dispersion in the physical properties of active material slurries.

In the conventional art, in order to produce a desired coating gap, it is necessary to repeat a task of disassembling and reassembling each die block while experimentally performing a coating process several times to adjust and check the coating gap. However, this coating gap is not only a variable that is adjusted sensitively enough to change even according to the fastening strength of bolts used for assembling between the die blocks, but also may be changed even by the force through which the active material slurry is discharged.

In order to configure a device having a foot print and volume similar to the conventional slot die coater 30 including one slot, the thickness of each of the die blocks must be thin, and for this reason, there is a problem of being structurally vulnerable to deformation and torsion inevitably. When deformation or torsion occurs, the painstakingly adjusted coating gap is twisted, which is a serious problem of causing defects in an electrode process.

DISCLOSURE

Technical Problem

The present disclosure is designed to solve the problems of the related art, and therefore the present disclosure is directed to providing a dual-slot die coater capable of easy coating gap adjustment and control of a width direction deviation of a coating gap.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a dual-slot die coater including a first slot and a second slot for discharging a coating solution in a direction opposite to gravity, the dual-slot die coater including a first die block vertically installed on a rear portion of an upper surface of a base, a second die block arranged on a front surface of the first die block to form the first slot between the second die block and the first die block, and a third die block arranged on a front surface of the second die block to form the second slot between the third die block and the second die block, and further including an alignment block provided between a front portion of the upper surface of the base and a lower surface of the second die block and fastened and coupled to the lower surface of the second die block and a lower surface of the first die block by bolts.

According to an embodiment of the present disclosure, the base and the first die block are integrated with each other.

The first slot may be perpendicular to the base.

A cross-section of the second die block may be a right triangle.

A vertical length of each of the second die block and the third die block may be less than a vertical length of the first die block.

The alignment block may include a stepped portion seated on the front portion of the upper surface of the base and a front surface of the base.

The bolts may include a bolt fastened to the alignment block and the second die block by penetrating through a lower surface of the base, and a bolt fastened to the third die block by penetrating through the alignment block.

The bolts may further include a bolt fastened to the base by penetrating through a front surface of the alignment block.

The lower surface of the second die block and a lower surface of the third die block may closely contact an upper surface of the alignment block and may be arranged with each other.

The first die block, the second die block, and the third die block may include a first die lip, a second die lip, and a third die lip as respective front end portions, respectively, and the first die lip, the second die lip, and the third die lip may be located on a same straight line.

A first discharge port communicatively connected to the first slot may be formed between the first die lip and the second die lip, and a second discharge port communicatively connected to the second slot may be formed between the second die lip and the third die lip, the dual-slot die coater may extrude and coat an active material slurry through at least one of the first slot and the second slot on a surface of a continuously running substrate, and a step may be formed between the first discharge port and the second discharge port.

The alignment block may be provided in plural in a width direction of the dual-slot die coater.

A vertical cross-section of the alignment block may include a first cross-section portion and a second cross-section portion extending vertically from the first cross-section portion. In other words, the vertical cross-section may have a '┐' or 'L' shape.

The alignment block may be a single monolithic component rather than being divided into several components.

Advantageous Effects

According to the present disclosure, respective lower surfaces of die blocks are aligned with each other through an alignment block. The respective lower surfaces of the die blocks may be naturally aligned with each other by a combination of the die blocks with respect to the alignment block. Then, misalignment between the die blocks may be prevented, and a distance between respective front end portions of the die blocks and a substrate, that is, a coating gap, may be always maintained at a desired degree. Since the die blocks are fixed through the alignment block, a once-determined coating gap is not easily changed during a process and is maintained, thereby suppressing occurrence of a variation in the coating gap in a width direction.

Therefore, according to the present disclosure, there is no need to adjust the coating gap while disassembling and reassembling the die blocks which are structurally weak because of their small thicknesses, and a constant coating gap may be maintained all the time by a simple operation of coupling the die blocks to the alignment block. The alignment block securely controls a uniform width direction gap through a large surface contact of a block.

According to the present disclosure, even considering that a die block is deformed by the pressure of a discharged active material slurry, there is an effect of uniformly controlling the coating amount and a coating quality by maintaining a uniform (±2%) coating gap. Thus, a coating product of uniform quality, in particular, an electrode for a secondary battery, may be obtained using a dual-slot die coater with a uniform coating gap.

As described above, according to the present disclosure, even when the discharge pressure of the active material slurry increases and thin die blocks are used, the effect of maintaining the once adjusted coating gap is excellent. This has the effect of securing coating process ability and securing reproducibility.

Using such a dual-slot die coater, it is possible to uniformly form a coating layer, in particular, an active material layer, to a desired thickness, and preferably, simultaneous coating of two types of active material slurries is possible, and thus there are effects that both performance and productivity are excellent.

According to the present disclosure, a plurality of alignment blocks may be arranged in the width direction of a dual-slot die coater. Then, precise control is possible without deviation of the coating gap in the width direction. Therefore, control may be made to exhibit uniform dimensional accuracy in order to stably perform uniform coating in the width direction even on a large-width current collector.

An appropriate coating gap range may be determined according to the type of active material slurry. In the present disclosure, several types of alignment blocks having appropriate thicknesses are prepared, and a process is performed by replacing alignment blocks necessary for production processes, and thus, in order to use various active material slurries, a dual-slot die coater may be used universally even when a dual-slot die coater dedicated to each active material slurry is not individually provided. Moreover, even when dispersion exists in an active material slurry, a quick response may be made to such dispersion by adjusting the coating gap by immediately replacing only the alignment block.

As described above, when the dual-slot die coater of the present disclosure is used to manufacture an electrode of a secondary battery by applying the active material slurry on a current collector while allowing the current collector to travel, there is an advantage that uniform coating is possible even under high-speed traveling or wide-width coating conditions.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

MODE FOR DISCLOSURE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

A dual-slot die coater according to an embodiment of the present disclosure is an apparatus that includes a first slot and a second slot for discharging a coating solution in a direction opposite to gravity and coats a coating solution in a double layer on a substrate. The 'substrate' described below is a current collector and the coating solution is an 'active material slurry'. Both a first coating solution and a second coating solution are active material slurries, and may refer to active material slurries that have the same or different composition (types of an active material, a conductive material, and a binder), content (an amount of each of the active material, the conductive material, and the binder), or physical properties. The dual-slot die coater according to an embodiment of the present disclosure is optimized for electrodes manufactured by applying at least two types of electrode active material slurries at the same time, or by applying at least two types of electrode active material slurries in an alternating manner to perform pattern coating. However, the scope of the present disclosure is not limited thereto. For example, the substrate may be a porous support constituting a separator, and the first coating solution and the second coating solution may be organic materials having different compositions or physical properties. In other words, when thin film coating is required, any substrate, any first coating solution, and any second coating solution may be good.

Figure 2:
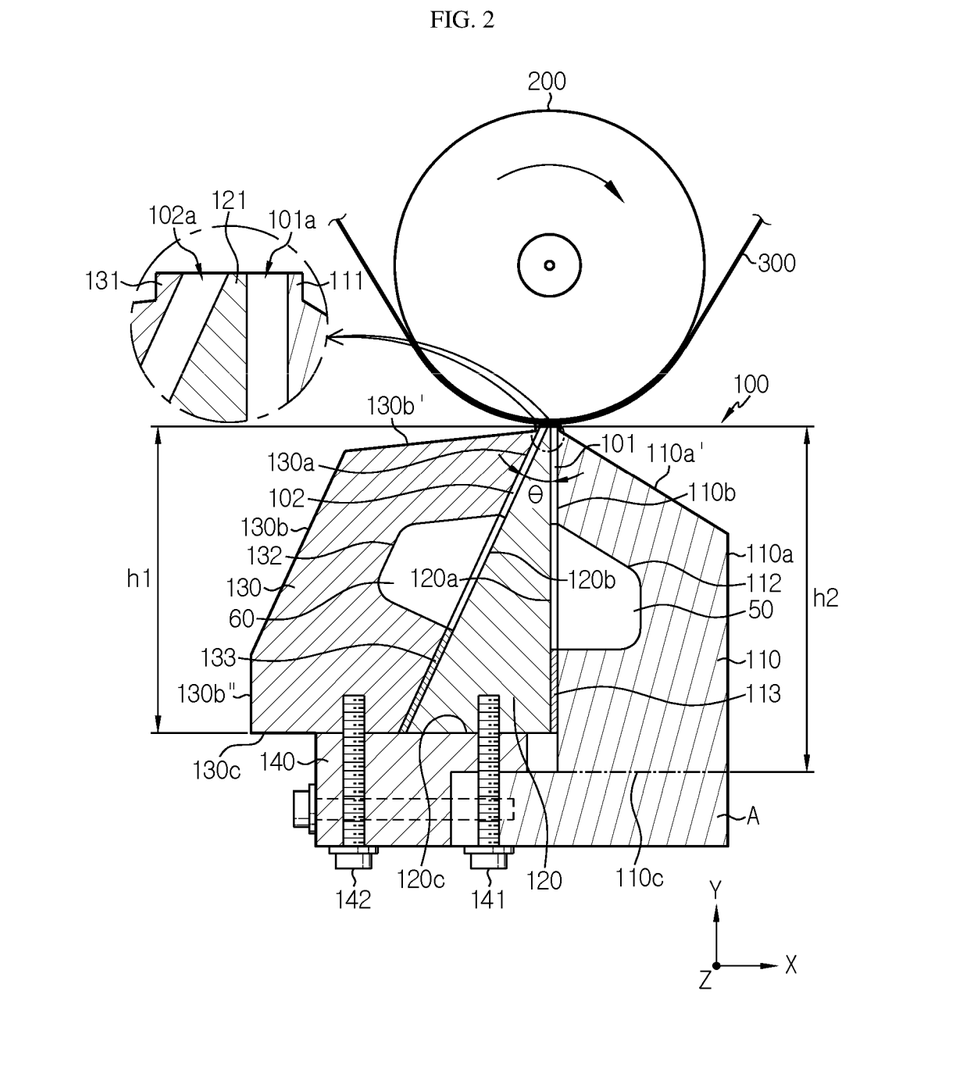
FIG. 2 is a schematic cross-sectional view of a dual-slot die coater according to an embodiment of the present disclosure.
Figure 3:
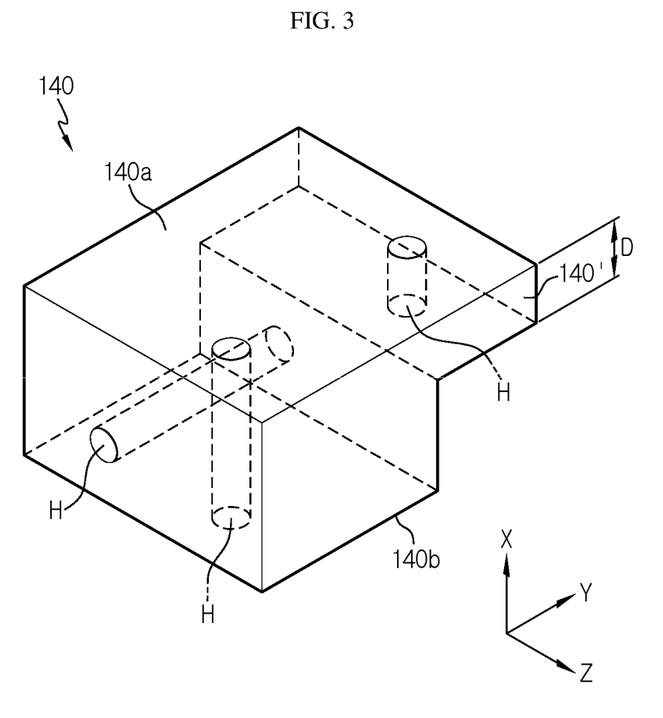
FIG. 3 is a perspective view of an alignment block included in the dual-slot die coater of FIG. 2.
Figure 4:
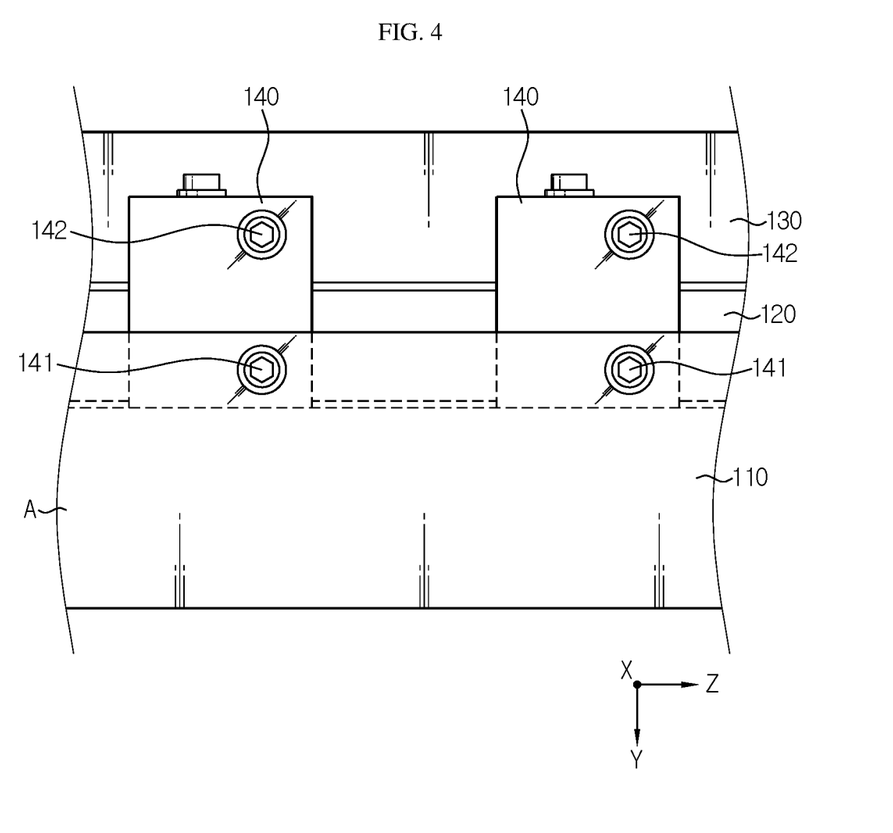
FIG. 4 is a plan view of a lower surface of a dual-slot die coater according to an embodiment of the present disclosure.

FIG. 2 is a schematic cross-sectional view of a dual-slot die coater according to an embodiment of the present disclosure, and FIG. 3 is a perspective view of an alignment block included in the dual-slot die coater of FIG. 2. FIG. 4 is a plan view of a lower surface of a dual-slot die coater according to an embodiment of the present disclosure.

A dual-slot die coater 100 according to an embodiment of the present disclosure is an apparatus including a first slot 101 and a second slot 102 and capable of simultaneously or alternately coating two types of same or different coating solutions on a substrate 300 through the first slot 101 and the second slot 102. Referring to FIG. 2, the dual-slot die coater 100 includes a base A, a first die block 110, a second die block 120, and a third die block 130.

In FIG. 2, the dual-slot die coater 100 is installed in a substantially vertical direction (X direction) in which an active material slurry which is a coating solution is discharged (approximately: ±5 degrees).

The base A may be viewed as a rectangular parallelepiped having a predetermined length in the left and right directions and extending in a direction (Z direction) perpendicular to the paper as shown in the drawings. The first die block 110 is vertically installed in a rear portion of an upper surface of the base A. Preferably, the base A and the first die block 110 are integrally formed with each other. The first die block 110 has a plate-shaped structure in which the direction (Z direction) perpendicular to the paper is a width direction and the first die block 110 extends along this direction. The first die block 110 is put on the base A and assembled therewith. When the base A and the first die block 110 are integrally formed with each other in this way, alignment with respect to the base A is not necessary, and the base A and the first die block 110 may be integrally handled, and thus handling is convenient.

The second die block 120 is a block located in the middle of blocks constituting the dual-slot die coater 100, and is a block disposed between the first die block 110 and the second die block 130 to form a dual slot. A cross-section of the second die block 120 of the present embodiment is a right triangle, but is not necessarily limited to this shape. For example, the cross section may be provided as an isosceles triangle.

The second die block 120 is disposed on a front surface of the first die block 110. The second die block 120 has a plate-shaped structure in which the direction (Z direction)

perpendicular to the paper is a width direction and the second die block 120 extends along this direction. A first surface 120*a* of the second die block 120 facing the first die block 110 lies almost perpendicular to the base A. In other words, the first surface 120*a* of the second die block 120 is a vertical surface. A second surface 110*b* of the first die block 110 facing the first surface 120*a* of the second die block 120, and the first surface 120*a* (that is, a surface forming a rear surface of an outer circumferential surface of the dual-slot die coater 100) opposite to the second surface 110*b* also lie almost perpendicular to the base A. In other words, the first and second surfaces 120*a* and 120*b* of the first die block 110 are vertical surfaces. In this way, the first surface 120*a* of the second die block 120 and a first surface 110*a* of the first die block 110, and the second surface 110*b* are almost parallel to each other. In the first die block 110, a forwardly-inclined inclined surface 110*a*' is formed above the first surface 110*a*, and accordingly a cross section of an upper portion of the first die block 110 is substantially triangular.

The third die block 130 is disposed on a front surface of the second die block 120. The third die block 130 also has a plate-shaped structure in which the direction (Z direction) perpendicular to the paper is a width direction and the second die block 120 extends along this direction. The second surface 120*b* of the second die block 120 facing the third die block 130, the first surface 130*a* of the third die block 130 facing the second surface 120*b* of the second die block 120, and the second surface 130*b* (i.e., a surface that forms a front surface of the outer circumferential surface of the dual-slot die coater 100), which is opposite to the first surface 130*a*, are almost parallel to one another. In the third die block 130, a rearwardly inclined surface 130*b*' is formed above the second surface 130*b*. A cross section of an upper portion of the third die block 130 is also substantially triangular. A surface 130*b*" below the second surface 130*b* of the third die block 130 lies almost perpendicular to the base A. In other words, the surface 130*b*" is also a vertical surface.

Surfaces of the first die block 110, the second die block 120, and the third die block 130 which are opposite to a direction in which the active material slurry is discharged, namely, lower surfaces 110*c*, 120*c*, and 130*c*, lie almost horizontally (Y direction). In such die blocks 110, 120, and 130, since corners formed by surfaces have portions formed at right angles, there is a right angle portion in the cross section, and since a vertical or horizontal surface is used as a reference surface, manufacturing or handling of the die blocks 110, 120, and 130 is easy and the precision thereof is guaranteed.

The first die block 110, the second die block 120, and the third die block 130 are not necessarily limited to shapes taken as the above examples, and may be configured, for example, as horizontal dies with the direction in which the active material slurry is discharged as a horizontal direction and the lower surfaces 110*c*, 120*c*, and 130*c* as bottom surfaces.

The die blocks 110, 120, and 130 are made of, for example, a SUS material. Materials that are easy to process, such as SUS420J2, SUS630, SUS440C, SUS304, and SUS316L, may be used. SUS has advantages in that it is easy to process, inexpensive, has high corrosion resistance, and may be manufactured in a desired shape at low cost.

The first die block 110 is a block located behind and on the right side in FIG. 2, from among the blocks constituting the dual-slot die coater 100, and, because the second surface 110*b* facing the second die block 120 is perpendicular to the base A, the first slot 101 may be perpendicular to the base A. The first slot 101 may be formed where the first die block 110 and the second die block 120 face each other. The first slot 101 is formed by a combination of the first die block 110 and the second die block 120. For example, a first spacer 113 is interposed between the first die block 110 and the second die block 120 to provide a gap therebetween, so that the first slot 101 corresponding to a passage through which a first coating solution 50 may flow may be formed. In this case, a thickness of the first spacer 113 determines a vertical width (slot gap) of the first slot 101.

The first spacer 113 includes an opening portion in which one area is cut, and may be interposed in a remaining portion except for one side of a border area of an opposite surface of each of the first die block 110 and the second die block 120. Accordingly, a first discharge port 101*a* through which the first coating solution 50 may be discharged to the outside is formed only between a front end portion of the first die block 110 and a front end portion of the second die block 120. The front end portion of the first die block 110 and the front end portion of the second die block 120 are defined as a first die lip 111 and a second die lip 121, respectively. In other words, the first discharge port 101*a* may be formed by making the first die lip 111 and the second die lip 121 spaced apart from each other. Each of the first die lip 111 and the second die lip 121 extends in the width direction, and may be a rectangular parallelepiped having a flat upper surface.

For reference, the first spacer 113 functions as a gasket to prevent the first coating solution 50 from leaking into a gap between the first die block 110 and the second die block 120 except for the area where the first discharge port 101*a* is formed, and thus the first spacer 113 is preferably made of a material having sealing properties.

The first die block 110 includes a first manifold 112 having a predetermined depth on the second surface 110*b* facing the second die block 120 and communicatively connected to the first slot 101. The first manifold 112 is a space provided from the second surface 110*b* of the first die block 110 facing the second die block 120 toward the first surface 110*a* opposite to the second surface 110*b*. The first manifold 112 is connected to a first coating solution supply chamber (not shown) installed outside through a supply pipe to receive the first coating solution 50. When the first coating solution 50 is filled in the first manifold 112, the flow of the first coating solution 50 is induced along the first slot 101 and discharged to the outside through the first discharge port 101*a*.

The third die block 130 is arranged in front of the second die block 120 and forms the second slot 102 between the third die block 130 and the second die block 120. The second slot 102 is thus formed where the second die block 120 and the third die block 130 face to each other. In other words, the second slot 102 is formed by a combination of the third die block 130 and the second die block 120.

Like the first slot 101 described above, a second spacer 133 may be interposed between the second die block 120 and the third die block 130 to provide a gap therebetween. Accordingly, the second slot 102 corresponding to a passage through which a second coating solution 60 may flow is formed. In this case, a vertical width (slot gap) of the second slot 102 is determined by the second spacer 133.

In addition, the second spacer 133, which also has a structure similar to that of the above-described first spacer 113, includes an opening portion in which one area is cut, and may be interposed in the remaining portion except for one side of a border area of an opposite surface of each of the second die block 120 and the third die block 130.

Similarly, a circumferential direction of the second spacer 133 except for the front of the second slot 102 is blocked, and the second discharge port 102a is formed only between the front end portion of the second die block 120 and a front end portion of the third die block 130. The front end portion of the third die block 130 is defined as a third die lip 131. In other words, the second discharge port 102a may be formed by making the second die lip 121 and the third die lip 131 spaced apart from each other. The third die lip 131 also extends in the width direction, and may be a rectangular parallelepiped having a flat upper surface.

The third die block 130 includes a second manifold 132 having a predetermined depth on the first surface 130a facing the second die block 120 and communicatively connected to the second slot 102. The second manifold 132 is a space provided from the first surface 130a toward the second surface 130b opposite to the first surface 130a. Although not shown in the drawings, the second manifold 132 is connected to a supply chamber of the second coating solution 60 installed outside through a supply pipe to receive the second coating solution 60. When the second coating solution 60 is supplied from the outside along the supply pipe in the shape of a pipe and filled in the second manifold 132, the flow of the second coating solution 60 is induced along the second slot 102 communicatively connected to the second manifold 132 and discharged to the outside through the second discharge port 102a.

The second slot 102 and the first slot 101 form a certain angle, and the angle may be approximately 20 degrees to 70 degrees. The second slot 102 and the first slot 101 may intersect each other at one point, and the second discharge port 102a and the first discharge port 101a may be provided near the intersection. Accordingly, discharge points of the first coating solution 50 and the second coating solution 60 may be concentrated approximately at one point.

The first and second manifolds 112 and 132 form the first die block 110 and the third die block 130, respectively. This may less affect deformation of the second die block 120, which is structurally weakest. In addition, when the second die block 120 is divided into a left die and a right die, the left die is configured to move integrally with the third die block 130, and the right die is configured to move integrally with the first die block 110, the second die block 120 may be implemented as a structure in which a left die block and a right die block are slidable at an interface between a left die and a right die, and thus may be implemented as a structure facilitating location changes in the first slot 101 and the second slot 102.

An angle θ between the second surface 120b of the second die block 120 facing the third die block 130 and the first surface 120a of the second die block 120 facing the first die block 110 may be preferably determined within a range in which an active material slurry discharged from the second discharge port 102a and an active material slurry discharged from the first discharge port 101a do not form a vortex immediately after being simultaneously discharged. When the angle θ is too small, the second die block 120 is too thin to be very vulnerable to deformation and torsion.

According to the dual-slot die coater 100 having such a configuration, a rotatably provided coating roll 200 is disposed over the dual-slot die coater 100, and, while the substrate 300 to be coated by rotating the coating roll 200 is being driven, the first coating solution 50 and the second coating solution 60 are continuously contacted with the surface of the substrate 300 so that the substrate 300 may be coated in a double layer. Alternatively, supply and interruption of the first coating solution 50 and supply and interruption of the second coating solution 60 are alternately performed so that pattern-coating may be intermittently performed on the substrate 300.

The dual-slot die coater 100 further includes an alignment block 140 that is fastened to the lower surfaces 120c and 130 of the die blocks 120 and 130, which are opposite to the front end portions of the die blocks 120 and 130, by bolts 141 and 142 to bond the two die blocks 120 and 130 together. The alignment block 140 is included between a front portion of the upper surface of the base A and the lower surface 120c of the second die block 120.

Here, an example in which a vertical length h1 of each of the second die block 120 and the third die block 130 is less than a vertical length h2 of the first die block 110 is taken. A vertical length indicates a vertical distance from the lower surface of each die block to a die lip. In this state, when the front end portion of the second die block 120 is aligned with that of the first die block 110, a space may be formed between the lower surface 120c of the second die block 120 and the upper surface of the base A. This space may be a space in which an upper surface is formed on the lower surface 120c of the second die block 120, an upper portion is formed by the upper surface of the base A, a front surface is open, a rear surface is formed by the front surface of the first die block 110, and left and right side portions are open.

The alignment block 140 is installed in this space. In particular, the alignment block 140 may include a stepped portion 140' seated on the front portion of the upper surface of the base A and the front surface of the base A. For example, the thickness D of the stepped portion 140' may correspond to a difference between the vertical length h1 of each of the second die block 120 and the third die block 130 and the vertical length h2 of the first die block 110.

The bolt 141 penetrates through the lower surface of the base A and is fastened to the alignment block 140 and the second die block 120 in a vertical direction. The bolt 142 penetrates through the alignment block 140 and is fastened to the third die block 130 in a vertical direction. A bolt 143 penetrates through the front surface of the alignment block 140 and is fastened to the base A in a horizontal direction. The bolts 141, 142, and 143 may be fastened at locations where they do not interfere with one another. Through this structure, the lower surface 120c of the second die block 120 and the lower surface 130c of the third die block 130 may be in contact with the upper surface of the alignment block 140 and aligned with each other, and the lower surface 120c of the second die block 120 and the lower surface 130c of the third die block 130 may have a step with the lower surface 110c of the first die block 110.

As shown in FIG. 3, the alignment block 140 has an upper surface 140a that is in contact with the lower surface 120c of the second die block 120 and the lower surface 130c of the third die block 130. In contrast with the upper surface 140a, the lower surface 140b includes the stepped portion 140' having the thickness D, which is less than a thickness of the other portion. The stepped portion 140' has a structure capable of being seated on the front portion of the upper surface of the base A and the front surface of the base A. In the alignment block 140, holes H through which the bolts 141, 142, and 143 penetrate may be further formed to fasten the bolts 141, 142, and 143. The number of holes H and the locations of the holes H may be changed from those shown in the drawings. A vertical cross-section of the alignment block 140 that passes through all of the upper surface 140a, the lower surface 140b, and the stepped portion 140' includes a first cross-section portion and a second cross-section portion extending vertically from the first cross-section portion. In other words, the vertical cross-section has a '⌐' or 'L' shape. In this way, processing of a simple block shape is not cumbersome, and precise processing is possible. By doing this, similar to the die blocks 110, 120, and 130, since corners formed by surfaces of the alignment block 140 are at right angles, there is a right angle portion in the cross section, and since a vertical or horizontal surface is used as a reference surface, manufacturing or handling of the alignment block 140 is easy and the precision thereof is guaranteed. When the first die block 110, the second die block 120, and the third die block 130 are combined and the alignment block 140 is fastened to the combination, facing portions thereof may be supported by one another with a high degree of surface contact, and thus may be fastened and fixed and may be maintained very well.

The dual-slot die coater may be generally formed of an SUS material. In general, since liquid leakage easily occurs on a bonding surface of an SUS assembly, a rubber ring or other soft material is placed between components and sealed to suppress leakage. However, this sealing method is not suitable for controlling a uniform assembly shape (e.g., an assembly deviation of less than 10 μm), and thus is difficult to apply to a dual-slot die coater.

For this reason, in the dual slot die coater, a die block processed with a very high precision (straightness, flatness±5 μm) needs to be assembled by bolting. To prevent liquid leakage, bolting is at a high pressure of about 200 to 350N. However, this high-pressure bolting cause a minute stress imbalance, block die deformation may be accordingly induced, and deformation or twisting of die blocks occur due to the pressure of a coating solution supplied during coating. The alignment block 140 having a cross section of a '⌐' or 'L' shape is a structure that may withstand such high-pressure bolting.

The alignment block 140 may be a single monolithic component rather than being divided into several components. In other words, the alignment block 140 is an integral, seamless component. Accordingly, not only accuracy of the alignment block 140 is improved during assembly, but also the structure of the alignment block 140 is robust, so the alignment block 140 has excellent stability against external shocks during handling and use.

According to the present embodiment, the alignment block 140 bonds the third die block 130 and the second die block 120 together. Because the lower surface 130c of the third die block 130 and the lower surface 120c of the second die block 120 are bonded in parallel, when the respective vertical lengths h1 of the second die block 120 and the third die block 130 are identical to each other, the third die lip 131 and the second die lip 121, which are respectively the front end portions of the die blocks 130 and 120), may be located on the same straight line. In other words, the third die lip 131 and the second die lip 121 may be at the same height from the base A, and a lower circumferential surface of the coating roll 200 is located with a coating gap over the third die lip 131 and the second die lip 121. In this way, the alignment block 140 determines locations of the third die lip 131 and the second die lip 121, thereby affecting the coating gap.

As shown in FIG. 4, several alignment blocks 140 may be arranged in the width direction of the dual-slot die coater 100. The alignment block 140 securely controls a uniform width direction gap through a large surface contact of a block.

According to this structure of the alignment block 140, the third die block 130 and the second die block 120 are combined to move integrally, and relative locations of the second discharge port 102a and the first discharge port 101a may be adjusted. The degree of location adjustment varies according to the thickness D of the stepped portion 140' of the alignment block 140, and the coating gap is determined accordingly. In addition, location misalignment between the die blocks 110, 120, and 130 may be prevented. In contrast with the conventional art, the coating gap is easily determined through a combination of the die blocks 130 and 120 with the alignment block 140. Therefore, inconvenience of adjusting the coating gap while dismantling the die blocks 130, 120, and 110 and adjusting the positions thereof may be greatly addressed, and assembly precision may be improved.

The present embodiment illustrates an example in which the vertical length h1 of the third die block 130 (vertical distance from the lower surface 130c to the third die lip 131) and the vertical length of the second die block 120 (vertical distance from the lower surface 120c to the second die lip 121) is less than the vertical length h2 of the first die block 110 (vertical distance from the lower surface 110c to the first die lip 111). In this state, when the alignment block 140 including the stepped portion 140' having the thickness D corresponding to a difference between the vertical lengths h1 and h2 is fastened to the third die block 130 and the second die block 120, the first die lip 111, the second die lip 121, and the third die lip 131 may be located on the same straight line. In this case, the entirety of the dual-slot die coater 100 may be coated with various layers while moving forwards or backwards with respect to the substrate 300.

If the vertical length of each of the third die block 130 and the second die block 120 is equal to the vertical length of the first die block 110, fastening of the alignment block 140 may make the second die lip 121 and the third die lip 131 protrude toward the substrate 300 farther than the first die lip 111. Then, a step is formed between the first discharge port 101a and the second discharge port 102a. When a step is formed between the first discharge port 101a and the second discharge port 102a as such and the first discharge port 101a and the second discharge port 102a are arranged apart from each other in a vertical direction, the second coating solution 60 discharged from the second outlet 102a is not transferred to the first outlet 101a, and the first coating solution 50 discharged from the first discharge port 101a is neither transferred to the second discharge port 102a. In other words, a coating solution discharged through the first discharge port 101a or the second discharge port 102a is blocked by a surface forming the step formed between the first discharge port 101a and the second discharge port 102a so that the coating solution has no fear of flowing into other discharge ports. Thus, a smoother multi-layer active material coating process may be conducted.

Through this fastening with the alignment block 140, a distance between the third die lip 131, the second die lip 121, and the first die lip 111, which are the respective front end portions of the die blocks 130, 120, and 110, and the substrate 300, namely, the coating gap, may be always maintained at a desired level, and the die blocks 130 and 120 are fixed to each other, and accordingly a once-determined coating gap is maintained without changing during a process.

Therefore, there is no need to adjust the coating gap while disassembling and reassembling the die blocks 130, 120, and 110 which are structurally weak because of their small thicknesses, and a constant coating gap may be maintained all the time by a simple operation of coupling the die blocks 130 and 120 to the alignment block 140.

According to the present disclosure, even considering that a die block is deformed by the pressure of a discharged active material slurry, there is an effect of uniformly controlling the coating amount and a coating quality by maintaining a uniform (±2%) coating gap. Thus, a coating product of uniform quality, in particular, an electrode for a secondary battery, may be obtained using a dual-slot die coater with a uniform coating gap.

As described above, according to the present disclosure, even when the discharge pressure of the active material slurry increases, the effect of maintaining the once adjusted coating gap is excellent. This has the effect of securing coating process ability and securing reproducibility.

Using such a dual-slot die coater, it is possible to uniformly form a coating layer, in particular, an active material layer, to a desired thickness, and preferably, simultaneous coating of two types of active material slurries is possible, and thus there are effects that both performance and productivity are excellent.

In particular, inclusion of a plurality of alignment blocks 140 in the width direction of the dual-slot die coater 100 enables precise control without a deviation of the coating gap even in the width direction.

An appropriate coating gap range is determined according to the type of active material slurry. In the present disclosure, several types of alignment blocks having stepped portions with appropriate thicknesses are prepared, and a process is performed by replacing an alignment block necessary for each production process, and thus, in order to use various active material slurries, a dual-slot die coater may be used universally even when a dual-slot die coater dedicated to each active material slurry is not individually provided. Moreover, even when dispersion exists in an active material slurry, a quick response may be made to such dispersion by immediately replacing only the alignment block.

As described above, when the dual-slot die coater of the present disclosure is used to manufacture an electrode of a secondary battery by applying the active material slurry on a current collector while allowing the current collector to travel, there is an advantage that uniform coating is possible even under high-speed traveling or wide-width application conditions.

In the present embodiment, a case of coating a coating solution in two layers or a case of pattern-coating by alternately supplying a coating solution has been described as an example. However, the present disclosure is applicable to a case where three or more layers are simultaneously coated by providing three or more slots.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, although terms indicating directions such as up, down, left, and right are used in the present specification, these terms are only for convenience of description, and it is apparent to those skilled in the art that these terms may vary depending on a position of a target object or a position of an observer.

What is claimed is:

1. A dual-slot die coater for discharging a coating solution in a direction opposite to gravity, the dual-slot die coater comprising:
    a first slot and a second slot;
    a first die block vertically installed on a rear portion of an upper surface of a base, a second die block arranged on a front surface of the first die block to form the first slot between the second die block and the first die block, and a third die block arranged on a front surface of the second die block to form the second slot between the third die block and the second die block; and
    an alignment block provided between a front portion of the upper surface of the base and a lower surface of the second die block and fastened and coupled to the lower surface of the second die block and a lower surface of the third die block by bolts, and
    wherein the lower surface of the second die block and a lower surface of the third die block directly contact an upper surface of the alignment block and are aligned with each other through the alignment block.

2. The dual-slot die coater of claim 1, wherein the base and the first die block are integrated with each other.

3. The dual-slot die coater of claim 1, wherein the first slot is perpendicular to the base.

4. The dual-slot die coater of claim 1, wherein a cross-section of the second die block is a right triangle.

5. The dual-slot die coater of claim 1, wherein a vertical length of each of the second die block and the third die block is less than a vertical length of the first die block.

6. The dual-slot die coater of claim 1, wherein the alignment block comprises a stepped portion seated on the front portion of the upper surface of the base and a front surface of the base.

7. The dual-slot die coater of claim 6, wherein the bolts comprise a bolt fastened to the alignment block and the second die block by penetrating through a lower surface of the base, and a bolt fastened to the third die block by penetrating through the alignment block.

8. The dual-slot die coater of claim 6, wherein the bolts further comprise a bolt fastened to the base by penetrating through a front surface of the alignment block.

9. The dual-slot die coater of claim 1, wherein the first die block, the second die block, and the third die block comprise a first die lip, a second die lip, and a third die lip, as respective front end portions, respectively, and the first die lip, the second die lip, and the third die lip are located on a same straight line.

10. The dual-slot die coater of claim 1, wherein the first die block, the second die block, and the third die block comprise a first die lip, a second die lip, and a third die lip, as respective front end portions, respectively,
    a first discharge port communicatively connected to the first slot is formed between the first die lip and the second die lip, and a second discharge port communicatively connected to the second slot is formed between the second die lip and the third die lip,
    the dual-slot die coater is configured to extrude and coat an active material slurry through at least one of the first slot and the second slot on a surface of a continuously running substrate, and
    a step is formed between the first discharge port and the second discharge port.

11. The dual-slot die coater of claim 1, wherein the alignment block is provided in plural in a width direction of the dual-slot die coater.

12. The dual-slot die coater of claim 1, wherein a vertical cross-section of the alignment block comprises a first cross-section portion and a second cross-section portion extending vertically from the first cross-section portion.

13. The dual-slot die coater of claim 1, wherein the second slot includes a coating gap along a width direction of the dual-slot die coater, and
    wherein the coating gap is configured to be maintained in a range of +/−2% of the coating gap in an initial state based on the direct contact among the second die block, the third die block, and the alignment block.

14. The dual-slot die coater of claim 7, wherein the stepped portion defines a hole through which the bolt fastened to the alignment block and the second die block penetrates therethrough.

\* \* \* \* \*